(12) United States Patent
Hines et al.

(10) Patent No.: US 7,432,488 B1
(45) Date of Patent: Oct. 7, 2008

(54) TRACKING SOLAR COLLECTOR WITH NON-UNIFORM SOLAR CELLS AND EMPIRICAL TRACKING SYSTEM INCLUDING SOLAR ANGLE INFORMATION

(75) Inventors: Braden E. Hines, Pasadena, CA (US); William Gross, Pasadena, CA (US)

(73) Assignee: Energy Innovations, Inc., Pasadena, CA (US)

( * ) Notice: Subject to any disclaimer, the term of this patent is extended or adjusted under 35 U.S.C. 154(b) by 0 days.

(21) Appl. No.: 11/731,507

(22) Filed: Mar. 30, 2007

Related U.S. Application Data

(60) Provisional application No. 60/788,543, filed on Mar. 30, 2006.

(51) Int. Cl.
*G01C 21/02* (2006.01)

(52) U.S. Cl. .................. 250/203.4; 250/203.1

(58) Field of Classification Search .............. 250/203.4, 250/203.6, 203.1, 221; 356/147, 149, 139.01; 136/246, 259, 600–605; 244/172.7, 172.8
See application file for complete search history.

(56) References Cited

U.S. PATENT DOCUMENTS 4,445,030 A * 4/1984 Carlton ..................... 250/203.4

* cited by examiner

*Primary Examiner*—Que T Le
(74) *Attorney, Agent, or Firm*—Andrew S. Naglestad

(57) ABSTRACT

A tracking concentrator with a positioning system for alternately aiming the tracking solar concentrator based on the sun or a database is disclosed. The preferred positioning system comprises a sensor adapted to detect an incident light level; a tracking database comprising solar angle information; an orientation processor; one or more actuators for aiming the one or more optical elements based on the orientation processor; wherein the orientation processor is configured to track the sun based on (a) the receiver if the sensed light level exceeds a determined threshold, and (b) the tracking database if the sensed light level does not exceed the determined threshold.

17 Claims, 3 Drawing Sheets

FIG. 7
| TIME | AZIMUTH | ELEVATION |
|------|---------|-----------|
| $T_1$ | $A_1$ | $E_1$ |
| $T_2$ | $A_2$ | $E_2$ |
| ⋮ | ⋮ | ⋮ |
| $T_n$ | $A_n$ | $E_n$ |
| ⋮ | ⋮ | ⋮ |
| $T_N$ | $A_N$ | $E_N$ |
SUNRISE → $T_1$ row
SUNSET → $T_N$ row
700
FIG. 8A
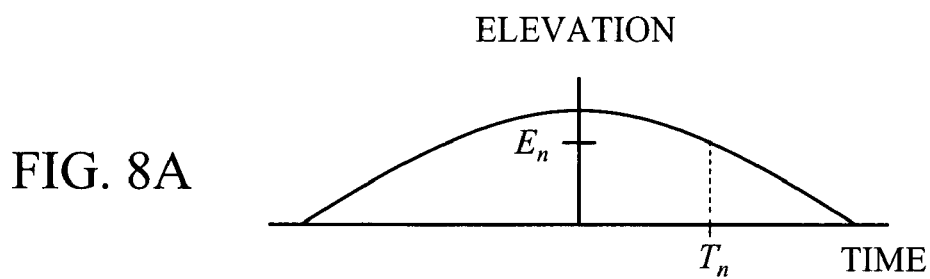
FIG. 8B
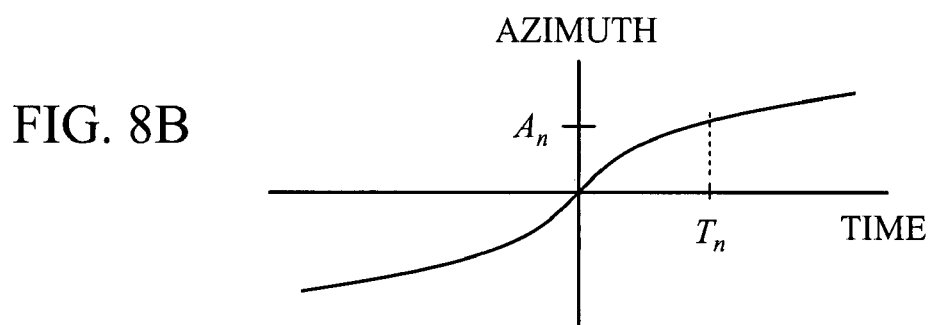

US 7,432,488 B1

TRACKING SOLAR COLLECTOR WITH NON-UNIFORM SOLAR CELLS AND EMPIRICAL TRACKING SYSTEM INCLUDING SOLAR ANGLE INFORMATION

CROSS-REFERENCE TO RELATED APPLICATION

This application claims the benefit of U.S. Provisional Patent Application Ser. No. 60/788,543 filed Mar. 30, 2006, entitled "SELF-ORIENTING SOLAR COLLECTOR WITH NON-UNIFORM SOLAR CELLS AND EMPIRICAL TRACKING SYSTEM," which is hereby incorporated by reference herein for all purposes.

TECHNICAL FIELD

The invention generally relates to solar concentrators for tracking the sun. In particular, the invention relates to a concentrator adapted to track the sun using a (1) differential current measurement from parallel lines of photovoltaic cells or (2) historical tracking database, depending on the environmental conditions.

BACKGROUND

Solar concentrators employ reflectors, lenses, or a combination thereof to concentrate incident light on a receiver. The resulting irradiance pattern projected onto the receiver is generally fairly non-uniform. The intensity in the central region of the receiver is generally much greater than the intensity at the periphery. This intensity variation can significantly impact the collection efficiency where the receiver consists of photovoltaic cells. Some concentrators use a secondary reflector to homogenize the light from the primary reflector. Although the secondary can improve the uniformity of the pattern of light on the receiver cells, some non-uniformity generally persists and the additional reflections in the secondary generally result in some inadvertent absorption of light. Additional loss of incident light may result from tracking errors that occur while the concentrator attempts to locate the sun or re-locate the sun after it reemerges from behind cloud cover, for example. There is therefore a need for a tracking concentrator that can compensate for non-uniform irradiance patterns, minimize losses due to tracking errors, and minimize losses do to target acquisition or re-acquisition.

SUMMARY

The problems with the prior art are addressed with the tracking concentrator of the preferred embodiment of the present invention, which features a positioning system for aiming a tracking solar concentrator or solar collector having one or more optical elements and a receiver. The preferred reflector positioning system comprises a sensor adapted to detect an incident light level; a tracking database comprising solar angle information; an orientation processor; one or more actuators for aiming the one or more optical elements based on the orientation processor; wherein the orientation processor is configured to track the sun based on (a) the receiver if the sensed light level exceeds a determined threshold, and (b) the tracking database if the sensed light level does not exceed the determined threshold.

In some embodiments, the solar angle information includes elevation angles and/or azimuth angles from a previous day. For example, the solar angle information used for tracking on a particular day may correspond to elevation/azimuth angles acquired while tracking during the one or more days preceding the particular day. The threshold that governs, at least in part, whether the tracking concentrator uses the tracking database is a user-defined threshold selected such that the orientation processor tracks the sun based on the tracking database when incident light is obscured by substantial cloud cover.

In some embodiments, the receiver comprises one or more photovoltaic cells configured in two substantially parallel arrays with the cells of each array being electrically connected in series. The orientation processor may then be configured to track the sun based, at least in part, on a current differential between the two parallel arrays of cells. In addition, the surface area of the photovoltaic may be selected such that each of the cells receives a substantial equal light intensity, thereby compensating for non-uniformity of the irradiance pattern projected onto the receiver. In particular, at least two of the plurality of photovoltaic cells may possess substantially different surface areas.

An exemplary method of tracking the sun with the solar concentrator of the preferred embodiment comprises receiving a light level signal from a sensor during daylight hours; tracking the sun based on (a) the sensor, if the sensed light level exceeds a determined threshold; and (b) the tracking database comprising solar angle information, if the sensed light level does not exceed the determined threshold; and driving one or more actuators for aiming the one or more optical elements based on the sensor or the tracking database. As described above, the receiver may include photovoltaic cells configured in two substantially linear arrays with the cells of each array electrically connected in series. Similarly, the photovoltaic cells may have a surface area that is selected such that each of the cells receives substantial equal light intensity when tracking the sun.

BRIEF DESCRIPTION OF THE DRAWINGS

The present invention is illustrated by way of example and not limitation in the figures of the accompanying drawings, and in which:

FIG. 7 is a historical tracking database compiled by the tracking concentrator, in accordance with the preferred embodiment of the present invention;

FIG. 8A is a plot of the daily azimuth angle data retained in the tracking database, in accordance with the preferred embodiment of the present invention; and FIG. 8B is a plot of the daily elevation angle data retained in the tracking database, in accordance with the preferred embodiment of the present invention.

DETAILED DESCRIPTION OF THE PREFERRED EMBODIMENT

Figure 1:
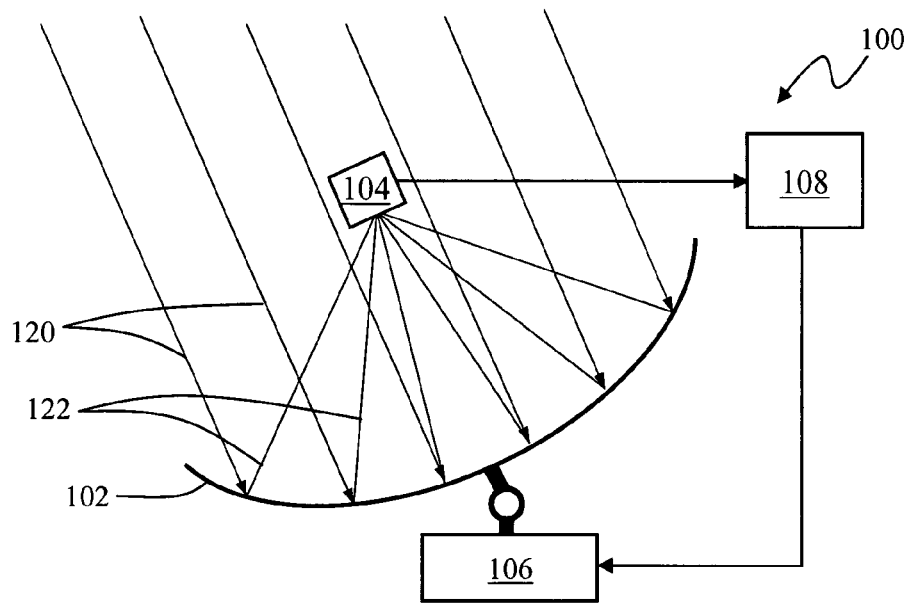
FIG. 1 is a diagrammatic side view of a tracking solar energy concentrator, in accordance with the preferred embodiment of the present invention.

Illustrated in FIG. 1 is a schematic side view of a tracking solar concentrator. The solar concentrator 100 comprises one or more reflectors 102, a receiver 104, and a reflector positioning system 106 with an orientation processor 108 for orienting the concentrator 100 towards the radiation source. The reflector positioning system 106 includes one or more actuators adapted to aim the reflector 102 in accordance with the orientation processor 108, thereby aiming the reflectors 102 to collect the incident radiation 120 and direct the reflected rays 122 to the receiver 104 as the radiation source moves. In the preferred embodiment, the reflector 102 is a parabolic trough, for example, although various other optical elements may also be employed including reflectors with cylindrical, parabolic, or faceted profile, as well as lenses with standard or Fresnel convergent lens. The receiver 104 preferably includes photovoltaic cells arrayed to form a line focus receiver adapted to receive solar flux along a line oriented approximately perpendicular to the page. Based on the sensed current acquired by the receiver 104, the orientation processor 108 generates one or more tracking or alignment-error signals to re-orient the reflector 102 and maximize the collection of incident radiation 120. The one or more tracking signals are used to drive the concentrator in a closed-loop control mode, which is the default mode enabled when the sun is visible and there are no adverse weather conditions or other forms of interference that obstruct the radiation source.

Figure 2A:
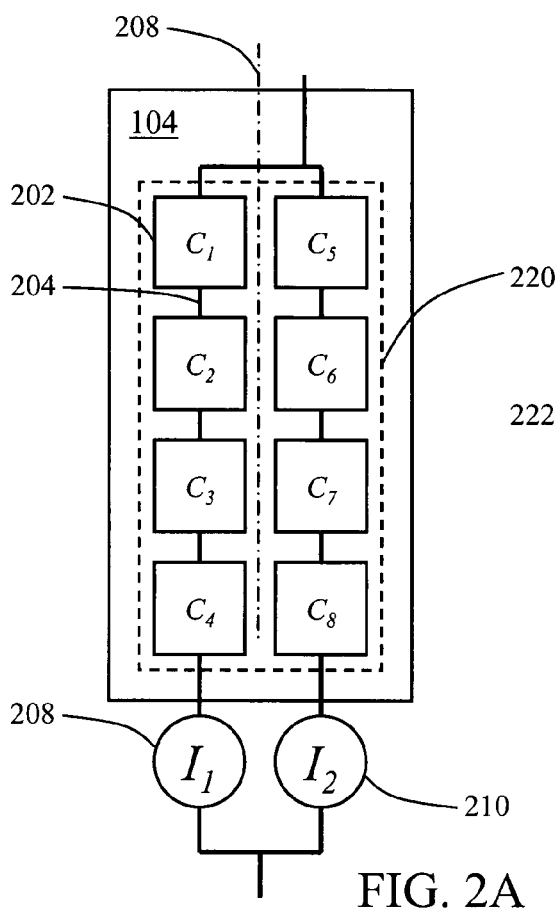
FIGS. 2A and 2B are of a receiver with two parallel lines of photovoltaic cells for generating a tracking signal, in accordance with the preferred embodiment of the present invention.
Figure 2B:
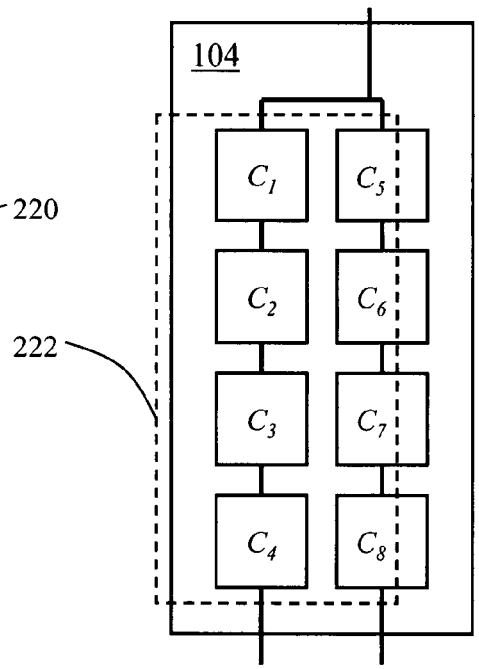

Illustrated in FIG. 2A and FIG. 2B is an exemplary receiver employed in the solar concentrator. The receiver 102 includes a plurality of energy sensors, preferably photovoltaic cells 202 for converting the received rays into electricity, although one skilled in the art will appreciate that various other forms of energy converters may also be employed including thermal absorbing liquids, heat exchangers, heat engines, and turbines, for example. The plurality of photovoltaic cells $C_1$-$C_8$ 202 are arrayed two dimensionally along the length of the line focus receiver 104 symmetrically disposed about the centerline 208 of the receiver. The centerline 208 coincides with or is in proximity to a focal line traversing the length of the solar concentrator parallel to the parabolic trough. Although the cells 202 are illustrated with a gap interposed between the cells to demonstrate that one or more cells on either side of the receiver centerline 208 may be electrically coupled in series via conductors 204, one skilled in the art will appreciate that the gap is generally minimized or eliminated in order to maximize the collection of light.

In the preferred embodiment, a first set of one or more cells $C_1$-$C_4$ to the left of the centerline 208 are coupled in series with a first ammeter 208, for example, while a second set of one or more cells $C_5$-$C_8$ to the right of the centerline 208 are coupled in series with a second ammeter 210. The light impinging on the receiver 104 creates an illumination footprint represented by outline 220. When the solar concentrator 100 is precisely oriented toward the sun, the first set of cells $C_1$-$C_4$ is illuminated with the same solar flux as the second set of cells $C_5$-$C_8$. The receiver 104 is therefore balanced and the current $I_1$ received from the first set of cells $C_1$-$C_4$ is substantially equal to that of the current $I_2$ received from the second set of cells $C_5$-$C_8$, thereby indicating that the concentrator is properly focused on the sun.

As illustrated in FIG. 2B, the illumination footprint or outline 222 of the impinging light shifts approximately perpendicular to the centerline 208 as the Earth rotates and the sun traces its diurnal path across the sky. With the light now improperly directed on the receiver 104, a higher current is sensed in the first set of cells $C_1$-$C_4$ than the second set of cells $C_5$-$C_8$. The orientation processor 108 then generates a tracking signal proportional to the difference in current between $I_1$ from the first ammeter 208 and $I_2$ from second ammeter 210. The tracking signal is provided as feedback to the reflector positioning system 106. The reflector positioning system 106 adjusts the orientation of the reflector 102 via one or more actuators to minimize the tracking error, thereby maximizing the absorption of solar flux and balancing the solar flux impinging on first and second sets of cells. The tracking signal is continuously monitored for purposes of tracking the sun.

Unlike prior art systems, the preferred embodiment of the present invention permits one to directly measure and control the output power, for example, in real time, without the need for dithering commonly employed in concentrators having a single string of solar cells that are wired in series. Dithering is generally less efficient because it requires that the concentrator be deliberately oriented away from the ideal track point in order to estimate the location of the ideal track point.

Figure 3:
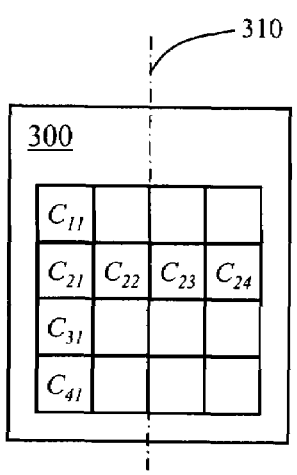
FIG. 3 is a plan view of a receiver with a plurality of equally-sized photovoltaic cells used in some prior art solar concentrators.

Illustrated in FIG. 3 is a multi-cell receiver consistent with the some modern solar concentrators. The receiver 300 includes a plurality of cells arrayed two dimensionally about the centerline 310 of the reflector 102 such as a parabolic trough, for example. In contemporary implementation, the centerline 310 coincides with or is in proximity to the focal line of the reflector 102. Subsets of two or more cells of the plurality of receiver cells may be operatively coupled in series.

Figure 4A:
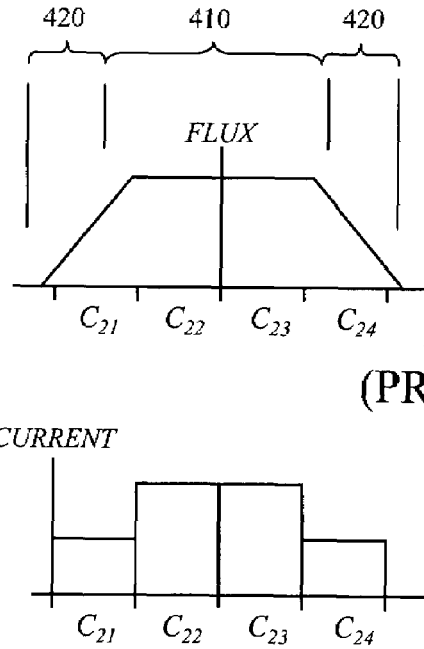
FIG. 4A is a non-uniform irradiance profile projected onto the receiver in some solar concentrators.
Figure 4B:
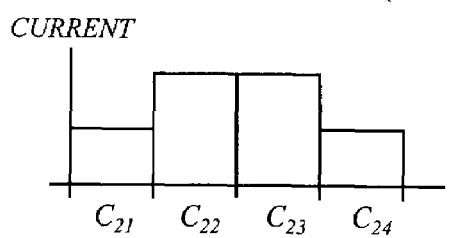
FIG. 4B is the current profile acquired with equally-sized photovoltaic cells and a non-uniform irradiance pattern.

Due to systematic errors in the concentrator and the non-zero diameter of the solar disk, for example, the distribution of light across the receiver 300 is generally characterized by a non-uniform intensity profile. As is schematically illustrated in FIG. 4A, the solar flux intensity varies across the width of the receiver perpendicular to the centerline 310. The intensity in the central region 410 of the receiver 310 coinciding with cell $C_{22}$ and cell $C_{23}$ is generally maximal while the intensity in proximity to the periphery 420 at cells $C_{21}$ and cell $C_{24}$ is significantly less than maximal. As illustrated in the current flow diagram of FIG. 4B, the current induced in the cells varies depending on whether the cell lies in the central region 410 or the periphery 420. In this example, cell $C_{21}$ and cell $C_{24}$ generate significantly less current than the maximal current generated by cell $C_{22}$ or cell $C_{23}$. The flux non-uniformity may also occur in cells arrayed in the direction parallel to the centerline 310 as well.

The non-uniform flux intensity, unfortunately, may significantly impact the efficiency of the receiver 300. Where a plurality of the cells are electrically coupled in series, the maximum current flow through the string of cells is limited to the current induced in the cell generating the least power. If cells $C_{21}$, $C_{22}$, $C_{23}$, and $C_{24}$ were coupled in series, the current passing through cells $C_{22}$ and $C_{23}$ would be limited to the current generated by cells $C_{21}$ and $C_{24}$.

Figure 5:
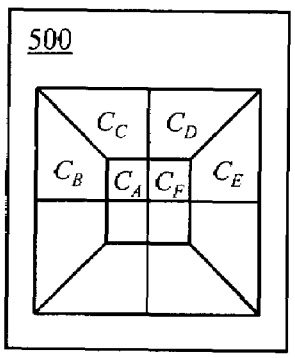
FIG. 5 is a plan view of a receiver with a plurality of differently-sized photovoltaic cells, in accordance with the preferred embodiment of the present invention.
Figure 6A:
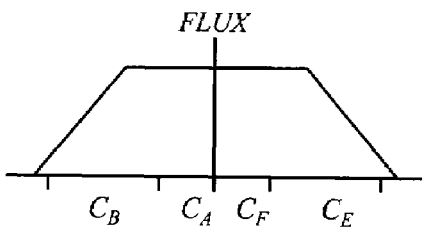
FIG. 6A is a non-uniform irradiance profile projected onto the receiver with a plurality of differently-sized photovoltaic cells.
Figure 6B:
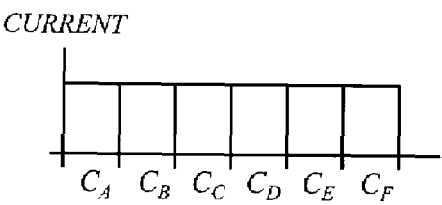
FIG. 6B is the current profile acquired with differently-sized photovoltaic cells and a non-uniform irradiance pattern, in accordance with the preferred embodiment of the present invention.

To overcome the limitations of the prior art and enable photovoltaic cells to be combined in series without the loss of efficiency experienced in the prior art, the solar energy concentrator 100 in some embodiments employs a plurality of cells that are sized to receive the same solar flux—an equal number of photons per cell—in the presence of the systematic errors with respect to the illumination of the receiver by the concentrator. In particular, the area of the cells is varied to compensate for the relative differences in solar flux that may be acquired by cells when the concentrator is perfectly aimed toward the radiation source. As illustrated in FIG. 5, the cells in the region of maximal solar flux, represented by cell $C_A$, have a relatively small surface area while the cells in the penumbra, represented by cell $C_B$ and cell $C_C$, have a relatively large surface area. The cells $C_B$, $C_C$ in the penumbra, however, are adapted to acquire the same total flux and generate the same current as the cell $C_A$ and cell $C_F$ in the central region of the receiver 500. The solar flux represented by the area under the flux curve in FIG. 6A is equal for each of the plurality of cells $C_A$-$C_F$. The current generated in the presence of the flux non-uniformity is also equal for each of the plurality of cells $C_A$-$C_F$. The resulting cells may then be coupled in series without the cells at the periphery serving to limit the current of the cells in the central region, thereby preventing the losses due to systematic flux non-uniformity.

The primary cause of flux non-uniformity are systematic errors, i.e., errors that are predictable and repeatable. Systematic errors may occur, for example, where the intensity of a mirror reflection falls off at its edge in a predictable way due to the non-zero diameter of the solar disk. Using the preferred embodiment of the present invention, the size of the cells are designed or otherwise selected to compensate for systematic errors and equalize the current flowing such that each cell receives the same amount of light, even though the cells are of different sizes.

In some embodiments of the present invention, the solar concentrator 100 is adapted to compile a historical tracking database. This tracking database includes solar direction data used to determine the position of the sun under adverse weather conditions, for example. The tracking database provides an empirical model with which to aim the solar energy concentrator 100, as opposed to a pre-determined astrophysical model which must generally be configured upon installation. When the level of incident light striking the receiver or other tracking sensor is below a user-determined threshold—coinciding with intervals of cloud cover—the orientation processor 108 causes the reflector positioning system 106 to switch over from the closed-loop control mode discussed above to an open-loop control mode in which the concentrator 100 is aimed using the historical tracking database without the tracking signal or other feedback. The open-loop control mode may also be enabled at sunrise to aim the concentrator in the direction of the sun before the sun might otherwise be located using the closed-loop control mode.

Illustrated in FIG. 7 is an exemplary historical tracking database compiled by the reflector positioning system 106 in the open-loop control mode. The tracking database is preferably a table 700 populated with empirical solar angle information recorded as a function of time during the solar tracking operations of one or more preceding days. The solar angle information preferably includes the azimuth angles $A_1$-$A_N$ and elevation angles $E_1$-$E_N$ for times $T_1$-$T_N$, respectively, recorded between sunrise and sunset. The tracking database 700 of FIG. 7 is illustrated graphically in the daily azimuth angle plot of FIG. 8A and the daily elevation angle plot of FIG. 8B. In the preferred embodiment, the historical tracking database is used on when a fail-over condition occurs, i.e., when the view of the sun in compromised by a cloud or other ubstruction. When the fail-over condition is satisfied and the open-loop control mode is enabled at time $T_n$, the reflector positioning system 106 retrieves the associated azimuth angle $A_n$ and elevation angle $E_n$ and direct the reflectors accordingly. The reflector positioning system 106 continues to orient the reflector 102 in accordance with the solar angle information as long as the fail-over condition is satisfied or until sunset.

In the preferred embodiment, the solar angle information includes reference data compiled from one or more previous days. By default, the reflector positioning system 106 uses the solar angle information recorded from the previous day. If, however, the previous day was also a cloudy day, for example, the data from two days prior is used. In general, the solar angle information may be associated with the last recorded day for which no fail-over condition occurred. Solar angle information collected and recorded during a given day may be discarded and not incorporated into the historical tracking database if the data collected is corrupted or compromised, i.e., one or more fail-over conditions were detected during its acquisition. In some embodiments, the decision whether to replace one or more historical solar angle data points with current angle data associated with the same point in time, i.e., same time stamp, may occur in real-time provided the fail-over condition is not satisfied.

The temporal resolution of the time data $T_1$-$T_N$—which may be on the order of one or more seconds or one or more minutes—is sufficient to point the concentrator 100 in the direction of the sun for the duration of the adverse weather condition. In the preferred embodiment, the reflector positioning system 106 generates a time of day estimate using a clock that is set by associating the time that the sun was highest in the sky with local noon, thereby obviating the need for a precision clock or burdensome user configuration. One skilled in the art will appreciate that the third preferred embodiment may be used to track the sun on a partly cloudy day or days where the sun is not continuously visible. While prior art concentrators typically lose time re-acquiring tracking when the sun comes back out, the present invention is able to rapidly re-acquire the target and reduce the power loss that might otherwise occur as the system slews to the correct tracking position when the sun comes out from behind a cloud, for example. As an additional advantage, the preferred embodiment of the present invention is unaffected by the way the unit is oriented on the user's roof and requires no calibration at time of installation or thereafter. Even when the concentrator 100 is tilted or rotated in arbitrary way, the concentrator automatically continues to track the sun in as little as one day since the empirical model is based on conditions observed the previous one or more days. It also requires no complex mathematics or algorithm development, and does not require that the concentrator 100 be aware of the actual local time since the local time is simply inferred based on the track of the sun across the sky.

One or more embodiments of the present invention may be implemented with one or more computer readable media, wherein each medium may be configured to include thereon data or computer executable instructions for manipulating data. The computer executable instructions include data structures, objects, programs, routines, or other program modules that may be accessed by a processing system, such as one associated with a general-purpose computer or processor capable of performing various different functions or one associated with a special-purpose computer capable of performing a limited number of functions. Computer executable instructions cause the processing system to perform a particular function or group of functions and are examples of program code means for implementing steps for methods disclosed herein. Furthermore, a particular sequence of the executable instructions provides an example of corresponding acts that may be used to implement such steps. Examples of computer readable media include random-access memory ("RAM"), read-only memory ("ROM"), programmable read-only memory ("PROM"), erasable programmable read-only memory ("EPROM"), electrically erasable programmable read-only memory ("EEPROM"), compact disk read-only memory ("CD-ROM"), or any other device or component that is capable of providing data or executable instructions that may be accessed by a processing system. Examples of mass storage devices incorporating computer readable media include hard disk drives, magnetic dish drives, tape drives, optical disk drives, and solid state memory chips, for example. The term processor as used herein refers to a number of processing devices including general purpose computers, special purpose computers, application-specific integrated circuit (ASIC), and digital/analog circuits with discrete components, for example.

Although the description above contains many specifications, these should not be construed as limiting the scope of the invention but as merely providing illustrations of some of the presently preferred embodiments of this invention.

Therefore, the invention has been disclosed by way of example and not limitation, and reference should be made to the following claims to determine the scope of the present invention.

We claim:

1. A reflector positioning system for a tracking solar concentrator comprising one or more optical elements and a receiver, the reflector positioning system comprises:
   a sensor adapted to detect an incident light level;
   a tracking database comprising solar angle information;
   an orientation processor;
   one or more actuators for aiming the one or more optical elements based on the orientation processor;
   wherein the orientation processor is configured to track the sun based on:
      a) the receiver if the sensed light level exceeds a determined threshold; and
      b) the tracking database if the sensed light level does not exceed the determined threshold.

2. The positioning system of claim 1, wherein the solar angle information comprises elevation angles and azimuth angles.

3. The positioning system of claim 2, wherein the solar angle information used for tracking on a particular day includes the tracking angles acquired while tracking on the one or more days preceding the particular day.

4. The positioning system of claim 1, wherein the determined threshold is user-defined.

5. The positioning system of claim 4, wherein the threshold is selected such that the orientation processor tracks the sun based on the tracking database when incident light is obscured by substantial cloud cover.

6. The positioning system of claim 1, wherein the receiver comprises one or more photovoltaic cells.

7. The positioning system of claim 6, wherein the one or more photovoltaic cells of said receiver are configured in two substantially parallel arrays, the cells of each array being electrically connected in series.

8. The positioning system of claim 7, wherein the orientation processor is configured to track the sun based at least in part on a current differential between the two arrays of cells.

9. The positioning system of claim 7, wherein the photovoltaic cells have a surface area selected such that each of the cells receives a substantial equal light intensity.

10. The positioning system of claim 9, wherein at least two of the plurality of photovoltaic cells possess substantially different surface areas.

11. The positioning system of claim 1, wherein the one or more optical elements comprise:
    one or more reflectors with a cylindrical, parabolic, or faceted profile; or
    one or more convergent lenses; or
    one or more Fresnel lenses.

12. The positioning system of claim 2, wherein the elevation angles and azimuth angles are recorded as a function of time, wherein the time is derived clock that is set by equating the highest position of the sun with noon local time.

13. A method of tracking the sun with a solar concentrator comprising one or more optical elements and a receiver, the method comprising:
    receiving a light level signal from a sensor during daylight hours;
    tracking the sun based on:
       a) the sensor, if the sensed light level exceeds a determined threshold; and
       b) a tracking database comprising solar angle information, if the sensed light level does not exceed the determined threshold; and
    driving one or more actuators for aiming the one or more optical elements based on the sensor or the tracking database.

14. The method system of claim 13, wherein the one or more photovoltaic cells comprise said receiver.

15. The method of claim 14, wherein the one or more photovoltaic cells of said receiver are configured in two substantially linear arrays, wherein the cells of each array are electrically connected in series.

16. The method of claim 15, wherein the photovoltaic cells have a surface area that is selected such that each of the cells receives a substantial equal light intensity when tracking the sun.

17. The method of claim 16, wherein at least two of the plurality of photovoltaic cells possess substantially different surface areas.

* * * * *